United States Patent [19]
Mauthe et al.

[11] Patent Number: 5,298,900
[45] Date of Patent: Mar. 29, 1994

[54] SIGMA-DELTA MODULATOR

[75] Inventors: Manfred Mauthe, Aying/Grosshelfendorf; Rudolf Koch, Oberhaching, both of Fed. Rep. of Germany

[73] Assignee: Siemens Aktiengesellschaft, Munich, Fed. Rep. of Germany

[21] Appl. No.: 30,815

[22] Filed: Mar. 12, 1993

[30] Foreign Application Priority Data

Mar. 12, 1992 [EP] European Pat. Off. ........ 92104317.0

[51] Int. Cl.$^5$ ............................................. H03M 3/02
[52] U.S. Cl. ...................................... 341/143; 375/26
[58] Field of Search .................... 341/143, 166; 375/26

[56] References Cited

U.S. PATENT DOCUMENTS

| | | | |
|---|---|---|---|
| 4,920,544 | 4/1990 | Endo et al. | 375/26 |
| 5,142,286 | 8/1992 | Ribner et al. | 341/143 |
| 5,148,167 | 9/1992 | Ribner | 341/143 |
| 5,162,799 | 11/1992 | Tanimoto | 341/143 |
| 5,189,419 | 2/1993 | Lyden | 341/143 |
| 5,198,817 | 3/1993 | Walden et al. | 341/143 |

FOREIGN PATENT DOCUMENTS 0328318 8/1989 European Pat. Off.
0450947 10/1991 European Pat. Off.

OTHER PUBLICATIONS

IEEE Transactions on Circuits and Systems, vol. 38, No. 5, May 5, 1991, New York, U.S., pp. 489–497, XP240137, L. A. Williams et al., "Third-Order Cascaded Sigma-Delta Modulators".

*Primary Examiner*—Marc S. Hoff
*Attorney, Agent, or Firm*—Herbert L. Lerner; Laurence A. Greenberg

[57] ABSTRACT

A sigma-delta modulator includes a first integrator receiving a difference between an input signal being weighted by a first coefficient, and a first reference signal being weighted by a second coefficient. A second integrator receives a difference between the output signal of the first integrator being weighted by a third coefficient, and the first reference signal being weighted by a fourth coefficient. A first quantizer receives the output signal of the second integrator being weighted by a fifth coefficient. A first digital/analog converter converts the output signal of the first quantizer into the first reference signal. A third integrator receives a difference between the output signal of the second integrator being weighted by a sixth coefficient, and a second reference signal being weighted by a seventh coefficient. A second quantizer receive the output signal of the third integrator being weighted by an eighth coefficient. A logic circuit adds together the output signals of the first and second quantizers. A second digital/analog converter converts the output signal of the logic circuit into the second reference signal. A first digital filter is connected downstream of the first quantizer, a second digital filter is connected downstream of the second quantizer, and the digital filters supply output signals being added together.

4 Claims, 2 Drawing Sheets

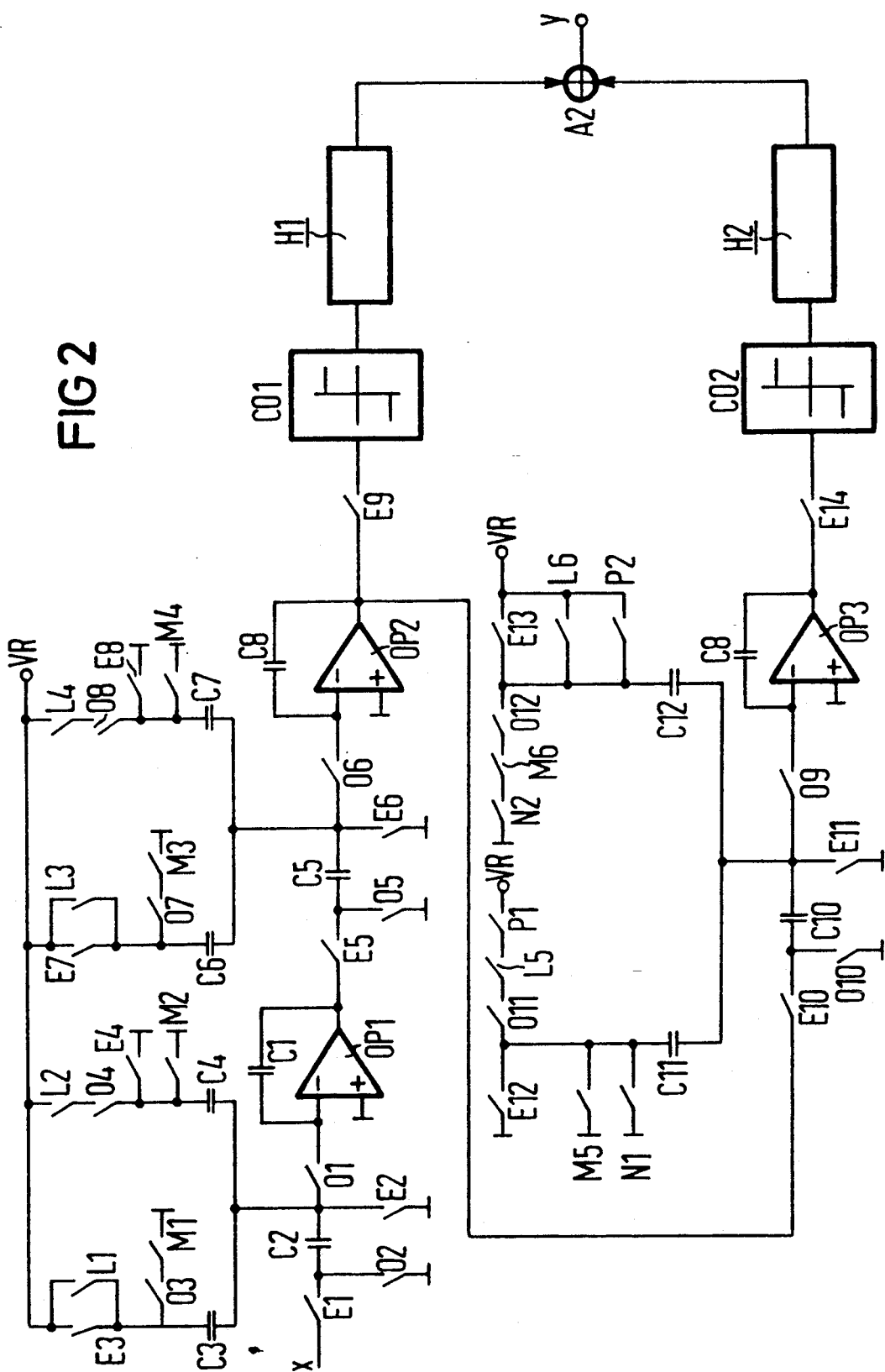

SIGMA-DELTA MODULATOR

BACKGROUND OF THE INVENTION

The invention relates to a sigma-delta modulator.

As compared with other types of converters, analog/digital converters with sigma-delta modulators are distinguished by the lower cost of analog circuitry. In the simplest case, namely for a first-order sigma-delta modulator, only one integrator with a differential input, one comparator for single-bit quantization and a reference voltage source for digital/analog conversion are required. High oversampling is then used instead of high resolution, and in a subsequent digital or in other words non-critical noise filter, a low-frequency, high-resolution signal is recovered from the high-frequency, low-resolution signal. The advantage then is that the attainable resolution is determined by the oversampling factor and the noise filtering, while conversely component tolerances do not substantially affect the resolution.

If the modulator order is increased, the resolution rises by 6 dB each time the oversampling factor is doubled. A first-order modulator has a resolution of approximately 9 dB per doubling of the oversampling factor. Therefore that value is approximately 15 dB for a second-order modulator and approximately 21 dB for a third-order modulator.

Second-order sigma-delta modulators are widely used, particularly in the audio field. In the case of a speech band with a bandwidth of 8 kHz and a sampling frequency of 1024 kHz, a resolution of approximately 80 dB or 13 bits is thus attained. By comparison, with a third-order sigma-delta modulator the same resolution is already attained at half the sampling frequency. Since the power consumption varies in proportion with the sampling frequency, power can be saved with a third-order modulator, despite the presence of a further integrator. That is particularly significant for battery-operated equipment.

Third-order sigma-delta modulators with a single feedback loop have stability problems, which is why cascading lower-order stable modulators are currently being done instead. Cascading first-order sigma-delta modulators has the advantage of not requiring scaling to avoid voltage magnification at the integrator outputs. In that kind of cascading, the quantization error of the first first-order sigma-delta modulator is digitally converted by the next sigma-delta modulator and then subtracted from the digital signal of the first sigma-delta modulator by a logical network. The output signal of the thus-formed third order sigma-delta modulator includes a noise component that originates in the first first-order sigma-delta modulator and cannot be fully compensated for.

In that respect, cascading of a second-order sigma-delta modulator and of a following first-order sigma-delta modulator is more favorable. However, the disadvantage of that circuit is that the noise is increased further because of the necessary scaling of the analog part, since the scaling must be rescinded again after the digital part after the quantization.

An article entitled "Third-Order Cascaded Sigma-Delta Modulators", by L. A. Williams and B. A. Wooley, in IEEE Transactions on Circuits and Systems, Vol. 38, No. 5, May 1991, discloses a third-order cascaded sigma-delta modulator circuit, including a second-order modulator and a following first-order modulator. Due to suitable scaling, that circuit does not have the disadvantage mentioned above. The known circuit includes a known integrator to which the difference, weighted with a first coefficient, between an input signal and a first reference signal is applied, and a second integrator to which the difference, weighted by a second coefficient, between the output signal of the first integrator and the first reference signal is applied. A first quantizer, to which the output signal of the second integrator is delivered, and a first digital/analog converter, which converts the output signal of the first quantizer into the first reference signal, are also provided. Moreover, the output signal of the second integrator, weighted by a third coefficient, is subtracted from the first reference signal, weighted by a fourth coefficient, and the resultant difference is then multiplied by a fifth coefficient. A second reference signal is subtracted from that product. The resultant difference is weighted by a sixth coefficient and delivered to a third integrator. The output of the third integrator is applied to a second quantizer, which in turn is followed by a second digital/analog converter for generating the second reference signal. Finally, each of the two quantizers are followed by respective digital filters, having output signals which are subtracted from one another and produce the output signal of the third-order sigma-delta modulator.

However, a disadvantage of such a sigma-delta modulator is that in constructing it with circuitry for coupling the second-order modulator to the first-order modulator, either one additional analog subtractor or an analog subtractor with three inputs is needed.

It is accordingly an object of the invention to provide a cascaded sigma-delta modulator with a higher-order modulator and a following first-order modulator, which overcomes the hereinafore-mentioned disadvantages of the heretofore-known devices of this general type.

With the foregoing and other objects in view there is provided, in accordance with the invention, a sigma-delta modulator, comprising a first integrator receiving a difference between an input signal being weighted by a first coefficient, and a first reference signal being weighted by a second coefficient, the first integrator supplying an output signal; a second integrator receiving a difference between the output signal of the first integrator being weighted by a third coefficient, and the first reference signal being weighted by a fourth coefficient, the second integrator supplying an output signal; a first quantizer receiving the output signal of the second integrator being weighted by a fifth coefficient, the first quantizer supplying an output signal; a first digital/analog converter receiving and converting the output signal of the first quantizer into the first reference signal; a third integrator receiving a difference between the output signal of the second integrator being weighted by a sixth coefficient, and a second reference signal being weighted by a seventh coefficient, the third integrator supplying an output signal; a second quantizer receiving the output signal of the third integrator being weighted by an eighth coefficient, the second quantizer supplying an output signal; a logic circuit receiving and adding together the output signals of the first and second quantizers and supplying an output signal; a second digital/analog converter receiving and converting the output signal of the logic circuit into the second reference signal; and a first digital filter connected downstream of the first quantizer, and a second digital filter connected downstream of the second quantizer, the digital filters supplying output signals being added together.

In accordance with another feature of the invention, the first digital filter forms a sum of the triply delayed output signal of the first quantizer being weighted by a ninth coefficient, the doubly delayed output signal of the first quantizer being weighted by the doubled, negative, ninth coefficient, and the singly delayed output signal of the first quantizer being weighted by the ninth coefficient+1; and the second digital filter forms a sum of the doubly delayed output signal of the second quantizer being weighted by a tenth coefficient, the doubled, negative, singly delayed output signal of the second quantizer, and the undelayed output signal of the second quantizer.

In accordance with an added feature of the invention, the first coefficient is equal to a reciprocal of a first constant being multiplied by a ratio of maximum quantity values of the input signal to the first reference signal; the second coefficient is equal to the reciprocal of the first constant; the third coefficient is equal to a ratio of the first constant to a second constant; the fourth coefficient is equal to twice a reciprocal of the second constant; the sixth coefficient is equal to a product of the second constant, a reciprocal of a third constant, and a fourth constant; the seventh coefficient is equal to twice the reciprocal of the third constant; the ninth coefficient is equal to twice a reciprocal of the fourth constant, minus 1; the tenth coefficient is equal to the reciprocal of the fourth constant; and the maximum quantity values of the two reference signals are of equal size.

In accordance with a concomitant feature of the invention, there is provided at least one further integrator connected upstream of the first integrator, the at least one further integrator receiving a difference between a respective input signal being weighted with further coefficients, and the first reference signal.

Other features which are considered as characteristic for the invention are set forth in the appended claims.

Although the invention is illustrated and described herein as embodied in a sigma-delta modulator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagram showing the way in which the embodiment is constructed with circuitry, using the switched capacitor technique.

Figure 1:
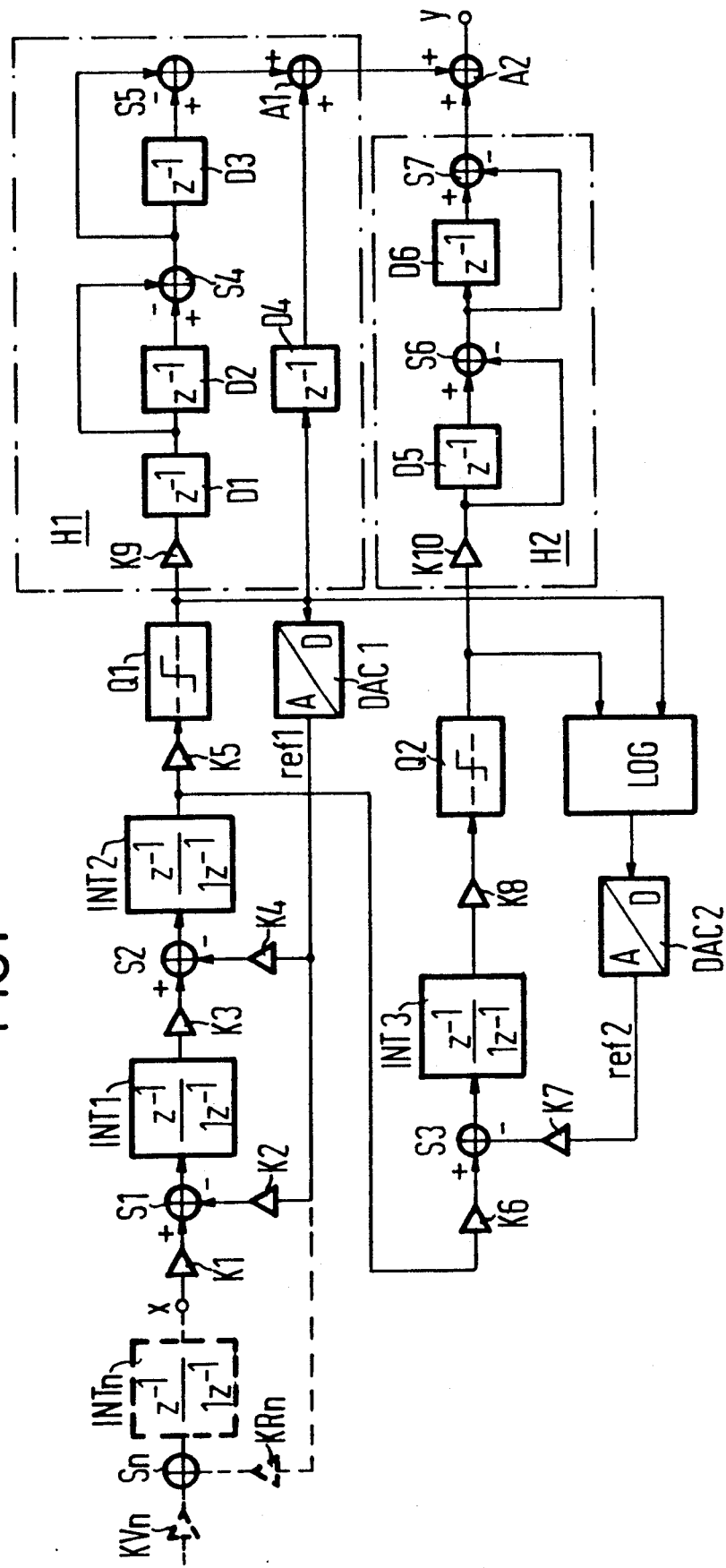
FIG. 1 is a schematic and block circuit diagram of a general embodiment of a sigma-delta modulator according to the invention.

Referring now to the figures of the drawing in detail and first, particularly, to FIG. 1 thereof, there is seen a sigma-delta modulator according to the invention, which includes a first integrator INT1, that is preceded by a subtractor S1. The subtractor S1 is supplied with both an input signal x, through a coefficient member having a coefficient K1, and with a reference signal ref1, through a coefficient member having a coefficient K2. An integrator INT2 is preceded by a subtractor S2, having a first input which is connected to the output of the integrator INT1 through a coefficient member having a coefficient K3 and having a second input which is triggered by the reference signal ref1 through a coefficient member having a coefficient K4. The output of the integrator INT2 is connected to the input of a quantizer Q1 through a coefficient member having a coefficient K5. The quantizer Q1 is followed by a digital/analog converter DAC1, which converts the output signal of the quantizer Q1 into the reference signal ref1.

A subtractor S3, having a first input which is connected to the output of the integrator INT2 through a coefficient member having a coefficient K6 and having a second input which is triggered by a reference signal ref2 through a coefficient member having a coefficient K7, is followed by an integrator INT3, which in turn is followed by a coefficient member having a coefficient K8 and a quantizer Q2. The outputs of the two quantizers Q1 and Q2 are additively linked together by means of a logic LOG. The logic LOG is followed by a digital/analog converter DAC2, which generates the reference signal ref2 from the signal output by the logic LOG.

A digital filter H1 following the quantizer Q1 includes a delay element D1, which is connected to the output of the quantizer Q1 through a coefficient member having a coefficient K9; a following delay element D2; a subtractor S4 connected to the outputs of the delay elements D1 and D2; a delay element D3 connected to the subtractor S4; a subtractor S5 connected to the outputs of the subtractor S4 and the delay element D3; a delay element D4 connected to the output of the quantizer Q1; and an adder A1 connected to the outputs of the subtractor S5 and the delay element D4. A digital filter H2 has a delay element D5 which is connected to the output of the quantizer Q2 through a coefficient member having a coefficient K10; a subtractor S6 connected to outputs of the delay element D5 and the coefficient member having the coefficient K10; a following delay element D6; and a subtractor S7 connected to the outputs of the subtractor S6 and the delay element D6. Finally, an adder A2 connected to the outputs of the adder A1 and the subtractor S7 has an output at which an output signal y is present.

The integrators INT1, INT2, INT3 are delaying integrators, having a z-transformed transfer function which is equal to $z^{-1}/1-z^{-1}$. In addition, the standardized input signal x and the standardized reference signals ref1, ref2 are assumed for the purposes of the further discussion herein. In addition, the integrators INT1, INT2, INT3, the quantizers Q1, Q2, and the digital/analog converters DAC1, DAC2 are assumed to be ideal, with their amplification factors being taken into account in the various preceding and succeeding coefficients of the coefficient members. An adaptation to real conditions can then be performed in a simple way by suitably changing the coefficients K1–K10.

The integrators INT1 and INT2, the quantizer Q1, the digital/analog converter DAC1 and the subtractors S1 and S2, in combination with the corresponding coefficient members, form a first stage of the sigma-delta modulator according to the invention, namely a second-order modulator. This modulator is followed by a first-order modulator that forms the second stage. It includes the integrator INT3, the quantizer Q2, the digital/analog converter DAC2 and the subtractor S3, in combination with the corresponding coefficient members. The second stage is supplied with an error signal from the first stage, which originates in the difference between the signal prior to the quantization, or in other words the output signal of the integrator INT2, and the reconverted quantized signal, that is the reference signal ref1. Unlike in the known sigma-delta modulator referred to at the outset above, this difference is not formed by an additional subtractor or by a subtractor having three inputs in the second stage. Only the output signal of the integrator INT2 is delivered directly to the second stage. The signal quantized by the quantizer Q1 is accordingly not reconverted by means of the digital/analog converter DAC1 and delivered as a reference signal ref1 to the second stage. Instead, the quantized signals at the outputs of the quantizers Q1 and Q2 are additively linked together by means of the logic LOG and then converted by the digital/analog converter DAC2. Therefore, the reference signal ref2 corresponds to the reconverted sum of the two quantized signals at the outputs of the quantizers Q1 and Q2. Instead of an exclusively analog subtraction, a partially analog and partially digital subtraction then occurs. The two stages are followed by the respective digital filters H1 and H2. The digital filter H1 forms the sum of the triply delayed output signal of the quantizer Q1, which is weighted by the coefficient K9, the doubly delayed output signal of the quantizer Q1, which is weighted by twice the negative coefficient K9, and the singly delayed output signal of the quantizer Q1, which is weighted with the coefficient K9+1. In general, the digital filter H1 can accordingly be described as a z-transformed transfer function $H1 = z^{-1} + K9 * (1-z^{-1})^2 * z^{-1}$. The digital filter H2, in the present exemplary embodiment, forms the sum of the doubly delayed output signal of the quantizer Q2, which is weighted by the coefficient K10, the doubled, negative, single delayed output signal of the quantizer Q2, and the undelayed output signal of the quantizer Q2. The transfer function H2 of the digital filter H2 is thus equal to $K10 * (1-z^{-1})^2$.

Preferably, the coefficients K1, K2, K3, K4, K6, K7, K9 and K10 are selected in such a way that the coefficient is equal to the reciprocal of a constant a multiplied by the ratio of the maximum quantity value vx of the input signal x to the reference signal ref1, wherein the quantity values of the reference signals ref1 and ref2 are equal in size. The coefficient K2 is then equal to the reciprocal of the constant a. The resultant value for each of the coefficients K3 and K4 is a value that is respectively equal to the ratio of the constant a to a constant b and equal to twice the reciprocal of a constant b. Moreover, the coefficient K6 is equal to the product of the constant b, a constant d, and the reciprocal of a constant c, and the coefficient K7 is equal to twice the reciprocal of the constant c. Finally, the coefficient K9 is equal to the reciprocal of the constant d−1, and the coefficient K10 is equal to the reciprocal of the constant d. The constants a, b, c correspond to damping factors of the integrators INT1, INT2 and INT3, for example, and the constant d forms an elective stabilization factor. In formal terms, this can be written as follows:

$K1 = vref/(a \cdot vx)$
$K2 = 1/a$
$K3 = a/b$
$K4 = 2/b$
$K6 = (b \cdot d)/c$
$K7 = 2/c$
$K9 = (1/d) - 1$
$K10 = 1/d$.

Moreover, the following values result for the coefficients K5 and K8
$K5 = b$
$K8 = c$.

These are merely purely computational variables that are contained in the comparators.

By way of example, it is assumed that the digital/analog converter DAC1 generates the values +1V, −1V, and the digital/analog converter DAC2 generates the values +1V, 0, −1V. The input signal x assumes values between −2V and +2V. This means that the maximum quantity value of the input signal x is equal to 2, and that the reference signals ref1, ref2 are equal to 1, that is vx=2, vref1=1 and vref2=1. From this, it then follows that the coefficient K1 becomes equal to 0.25; the coefficients K2, K3, K4 become equal to 0.5; the coefficients K6, K7, K9 become equal to 1; the coefficients K8, K10 become equal to 2; and the coefficient K5 becomes equal to 4.

In the case of the z transform Y(z) of the output signal y, the result, as a function of the z transform X(z) of the input signal x and the z transform $N_2(z)$ of the quantization noise of the quantifier Q2, is:

$$Y(z) = z^{-3} * x(z) + (1-z^{-1})^3 * N_2(z).$$

Different embodiments can be attained by transposition of this equation or by adaptation of the coefficients K1–K10 to the conditions prevailing in a given case. It is moreover possible, by preceding this with further integrators INTn in combination with corresponding subtractors Sn and coefficient members KVn, KRn, to increase the order of the first stage.

In the version of a sigma-delta modulator according to the invention, which is made by the switched capacitor technique and is shown in FIG. 2 of the drawing, an operational amplifier OP1 is provided, which is fed back between an output and an inverting input thereof through a capacitor C1, and which has a non-inverting input that is at a nominal potential. The inverting input of the operational amplifier OP1 can also be carried through a switch O1 to one terminal of a capacitor C2. The input signal x can be carried through a switch E1, and the nominal potential can be carried through a switch O2, to the other terminal of the capacitor C2. A switch E2 is located between the nominal potential and the one terminal of the capacitor C2, which is additionally connected to one terminal of each of two capacitors C3 and C4. The other terminal of the capacitor C3 can be coupled firstly through a switch E3 and a switch L1 that are connected in parallel, to a reference potential VR, and secondly through a switch O3 and a switch M1 that are connected in series, to the nominal potential. The other terminal of the capacitor C4 can be carried to the reference potential VR through a series circuit of a switch L2 and a switch O4 and can be carried to the nominal potential through a parallel circuit of a switch E4 and a switch M2.

A switch E5 is located between the output of the operational amplifier OP1 and one terminal of a capacitor C5. A switch O5 is also placed between the one terminal of the capacitor C5 and the nominal potential. The other terminal of the capacitor C5 is connected to one terminal of each of a capacitor C6 and a capacitor C7, and can also be coupled both to a non-inverting input of an operational amplifier OP2 through a switch O6, and to the nominal potential through a switch E6. The operational amplifier OP2 has a non-inverting input which is at nominal potential and it is fed back through a capacitor C8 between an output and the inverting input. The other terminal of the capacitor C6 can be coupled firstly to the reference potential VR through two parallel switches E7 and L3, and secondly to the nominal potential through two series-connected switches O7 and M3. The other terminal of the capacitor C7 can be connected to the reference potential VR through a series circuit of a switch O8 and a switch L4, and it can be connected to the nominal potential through the parallel circuit of a switch E8 and a switch M4.

Finally, an output of the operational amplifier OP2 can be coupled through a switch E9 to the input of a comparator CO1, which forms the quantizer Q1 of FIG. 1. This element is then followed by the digital filter H1.

The second stage that follows includes an operational amplifier OP3 which has a non-inverting input that is at the nominal potential and which is fed back between an output and a non-inverting input thereof through a capacitor C9. The inverting input of the operational amplifier OP3 can also be coupled through a switch O9 to one terminal of a capacitor C10 that has another terminal which can be connected firstly to the output of the operational amplifier OP2 through a switch E10, and secondly to the nominal potential through a switch O10. The one terminal of the capacitor C10 can also be coupled to the nominal potential through a switch E11 and is connected to one terminal of each of two capacitors C11 and C12. The other terminal of the capacitor C11 can be firstly connected to the nominal potential through a parallel circuit of a switch E12, a switch M5 and a switch N1, and can be secondly connected to the reference potential VR through a series circuit of a switch O11, a switch L5 and a switch P1. The other terminal of the capacitor C12 can be coupled to the nominal potential through a series circuit of a switch O12, a switch M6 and a switch N2, and can be connected to the reference potential VR through a parallel circuit of a switch E13, a switch L6 and a switch P2.

A switch E14 is placed between an input of a comparator CO2 and the output of the operational amplifier OP3. The comparator CO2 forms the quantizer Q2 of FIG. 1 and is followed by the filter H2. The outputs of the two digital filters H1 and H2 are carried to the adder A2, which was already described above for FIG. 1.

All of the switches are controllable switches. The switches E1–E14 are controlled by one phase of a clock signal, and the switches O1–O12 are controlled by the other phase of this clock signal. In addition, the switches L1–L6 are controlled by the output signal of the comparator CO1, and the switches M1–M6 are controlled by its inverted output signal. Finally, the switches P1 and P2 and the switches N1 and N2 are respectively driven by the output signal and the inverted output signal of the comparator CO2. If a standardized value is assumed for the capacitors C1, C8 and C9, and this value is assumed to be equal to one, then the resultant value is K1 for the capacitor C2, K2 for the capacitors C3 and C4, K3 for the capacitor C5, and K4 for the capacitors C6 and C7. Accordingly, a value K6 is provided for the capacitor C10 and the value K7 for the capacitors C11 and C12. The values of the coefficients K5 and K8 of FIG. 1 represent computational values, which are defined by the two comparators CO1 and CO2. The reference voltage VR is also selected in such a way that it is equal to the maximum value of the input signal x.

The sigma-delta modulator of FIG. 2 is constructed in such a way that in addition to the reference signal that already occurs in the digital/analog converter of the first stage and assumes only two values, namely the positive and the negative value of the reference voltage VR, the digital/analog converter of the second stage only has to generate the value 0. In the present switch-to-capacitor-type sigma-delta modulator, the two digital/analog converters are constructed of a single reference voltage source, which generates the reference voltage VR, and of the respective associated switches. In the case of the digital/analog converter of the first stage, these are the switches L1–L4 and M1–M4. In the case of the digital/analog converter of the second stage, the switches P1 and P2, and N1 and N2, are provided for that purpose. The logical linkage of the output signals of the two quantizers, that is of the two comparators CO1 and CO2, is likewise effected by switches, which are additionally used for the digital/analog converter of the second stage. These are the switches L5, L6, M5 and M6.

Finally, the coefficients K1, K2, K3 and K4 are selected to equal 0.5, the coefficients K6, K7 and K9 to equal 1, the coefficients K8 and K10 to equal 2, and the coefficient K5 to equal 4. The result for the capacitors C2–C7 is half the value, and for the capacitors C10–C12 twice the value, of the capacitors C1, C8, C9.

We claim:
1. A sigma-delta modulator, comprising:
   a first integrator receiving a difference between an input signal being weighted by a first coefficient, and a first reference signal being weighted by a second coefficient, said first integrator supplying an output signal;
   a second integrator receiving a difference between the output signal of said first integrator being weighted by a third coefficient, and the first reference signal being weighted by a fourth coefficient, said second integrator supplying an output signal;
   a first quantizer receiving the output signal of the second integrator being weighted by a fifth coefficient, said first quantizer supplying an output signal;
   a first digital/analog converter receiving and converting the output signal of said first quantizer into the first reference signal;
   a third integrator receiving a difference between the output signal of said second integrator being weighted by a sixth coefficient, and a second reference signal being weighted by a seventh coefficient, said third integrator supplying an output signal;
   a second quantizer receiving the output signal of said third integrator being weighted by an eighth coefficient, said second quantizer supplying an output signal;
   a logic circuit receiving and adding together the output signals of said first and second quantizers and supplying an output signal;
   a second digital/analog converter receiving and converting the output signal of said logic circuit into the second reference signal; and a first digital filter connected downstream of said first quantizer, and a second digital filter connected downstream of said second quantizer, said digital filters supplying output signals being added together.

2. The sigma-delta modulator according to claim 1, wherein:
said first digital filter forms a sum of the triply delayed output signal of said first quantizer being weighted by a ninth coefficient, the doubly delayed output signal of said first quantizer being weighted by the doubled, negative, ninth coefficient, and the singly delayed output signal of said first quantizer being weighted by the ninth coefficient +1; and
said second digital filter forms a sum of the doubly delayed output signal of said second quantizer being weighted by a tenth coefficient, the doubled, negative, singly delayed output signal of said second quantizer, and the undelayed output signal of said second quantizer.

3. The sigma-delta modulator according to claim 2, wherein:
the first coefficient is equal to a reciprocal of a first constant being multiplied by a ratio of maximum quantity values of the input signal to the first reference signal;
the second coefficient is equal to the reciprocal of the first constant;
the third coefficient is equal to a ratio of the first constant to a second constant;
the fourth coefficient is equal to twice a reciprocal of the second constant;
the sixth coefficient is equal to a product of the second constant, a reciprocal of a third constant, and a fourth constant;
the seventh coefficient is equal to twice the reciprocal of the third constant;
the ninth coefficient is equal to twice a reciprocal of the fourth constant, minus 1;
the tenth coefficient is equal to the reciprocal of the fourth constant; and
the maximum quantity values of the two reference signals are of equal size.

4. The sigma-delta modulator according to claim 1, including at least one further integrator connected upstream of said first integrator, said at least one further integrator receiving a difference between a respective input signal being weighted with further coefficients, and the first reference signal.

* * * * *